US012685083B2

(12) United States Patent　(10) Patent No.:　US 12,685,083 B2

Hitomi et al.　(45) Date of Patent:　Jul. 14, 2026

(54) CASSETTE HOUSING, PROBER, SERVER RACK, AND STORAGE SYSTEM

(71) Applicant: Kioxia Corporation, Tokyo (JP)

(72) Inventors: Tatsuro Hitomi, Hiratsuka Kanagawa (JP); Yasuhito Yoshimizu, Kawasaki Kanagawa (JP); Arata Inoue, Chigasaki Kanagawa (JP); Hiroyuki Dohmae, Yokohama Kanagawa (JP); Kazuhito Hayasaka, Tokyo (JP); Tomoya Sanuki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 342 days.

(21) Appl. No.: 18/371,536

(22) Filed: Sep. 22, 2023

(65) Prior Publication Data

US 2024/0014061 A1　Jan. 11, 2024

Related U.S. Application Data

(63) Continuation of application No. PCT/JP2021/011858, filed on Mar. 23, 2021.

(51) Int. Cl.

| | |
|---|---|
| *H10P 72/30* | (2026.01) |
| *G01R 1/067* | (2006.01) |
| *G01R 1/073* | (2006.01) |
| *H10P 72/00* | (2026.01) |
| *H10P 74/00* | (2026.01) |

(52) U.S. Cl.
CPC ...... *H10P 72/3404* (2026.01); *G01R 1/06755* (2013.01); *G01R 1/07314* (2013.01); *H10P 72/0602* (2026.01); *H10P 72/3218* (2026.01); *H10P 72/3412* (2026.01); *H10P 74/273* (2026.01)

(58) Field of Classification Search
CPC ......... H01L 21/67769; H01L 21/67248; H01L 21/6773; H01L 21/67781; H01L 22/32; G01R 1/06755; G01R 1/07314
See application file for complete search history.

(56) References Cited

U.S. PATENT DOCUMENTS

| | | | | |
|---|---|---|---|---|
| 3,963,985 | A | * | 6/1976 | Geldermans ....... G01R 1/07314 324/756.01 |
| 5,981,971 | A | * | 11/1999 | Miyakawa ..... G01R 31/318505 324/756.07 |
| 6,072,325 | A | | 6/2000 | Sano |
| 7,975,759 | B2 | | 7/2011 | Hatta et al. |
| 10,663,511 | B2 | | 5/2020 | Kobayashi |

(Continued)

FOREIGN PATENT DOCUMENTS

| | | |
|---|---|---|
| CN | 109425764 A | 3/2019 |
| JP | 2020-188076 A | 11/2020 |

(Continued)

*Primary Examiner* — Paresh Patel

(74) *Attorney, Agent, or Firm* — Maier & Maier, PLLC

(57) ABSTRACT

According to one embodiment, a cassette housing includes a storage unit, a probe card, and a container. The storage unit stores a semiconductor wafer including a plurality of non-volatile memory chips. The probe card includes a probe. The probe is configured to be brought into contact with a pad electrode provided on the semiconductor wafer. The container contains heat transfer fluid for lowering or raising temperature of one or both of the probe card and the semiconductor wafer stored in the storage unit.

10 Claims, 5 Drawing Sheets

(56) References Cited

U.S. PATENT DOCUMENTS

| | | | |
|---|---|---|---|
| 2006/0145715 A1* | 7/2006 | Salmon | G01R 31/2886 |
| | | | 324/750.08 |
| 2009/0072848 A1* | 3/2009 | Eldridge | G01R 31/2887 |
| | | | 324/762.05 |
| 2010/0141288 A1* | 6/2010 | Di Lello | G01R 31/2889 |
| | | | 324/762.02 |
| 2012/0194213 A1* | 8/2012 | Komatsu | G01R 31/2887 |
| | | | 324/756.03 |
| 2019/0064219 A1 | 2/2019 | Rhee et al. | |
| 2019/0393056 A1* | 12/2019 | Hirochi | H01L 21/67017 |
| 2021/0149568 A1 | 5/2021 | Yoshimizu et al. | |
| 2022/0204270 A1 | 6/2022 | Yoshimizu et al. | |
| 2022/0223552 A1 | 7/2022 | Yoshimizu et al. | |

FOREIGN PATENT DOCUMENTS

| | | |
|---|---|---|
| WO | 2021/095251 A1 | 5/2021 |
| WO | 2021/095252 A1 | 5/2021 |
| WO | 2022/201283 A1 | 9/2022 |

* cited by examiner

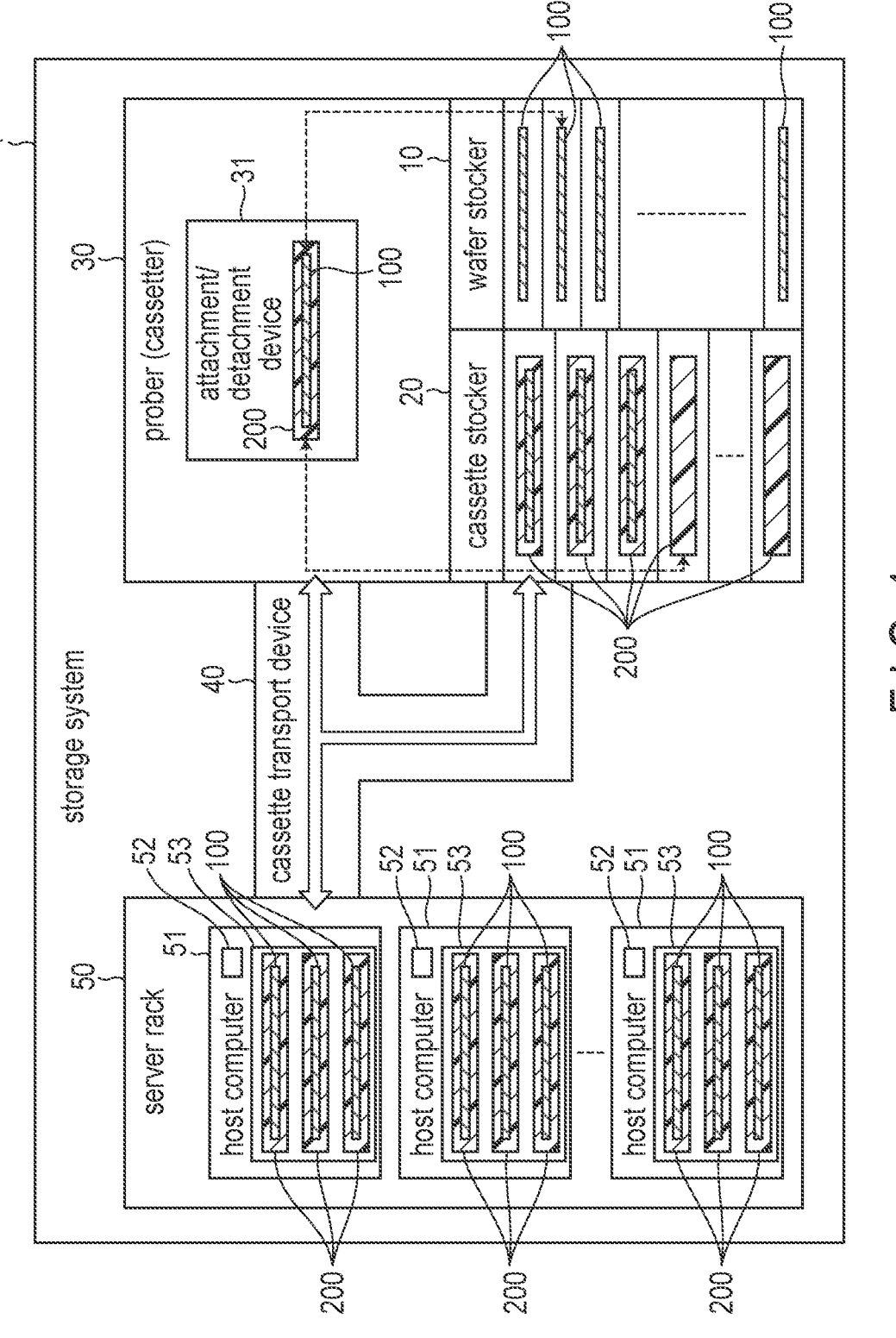
F I G. 1

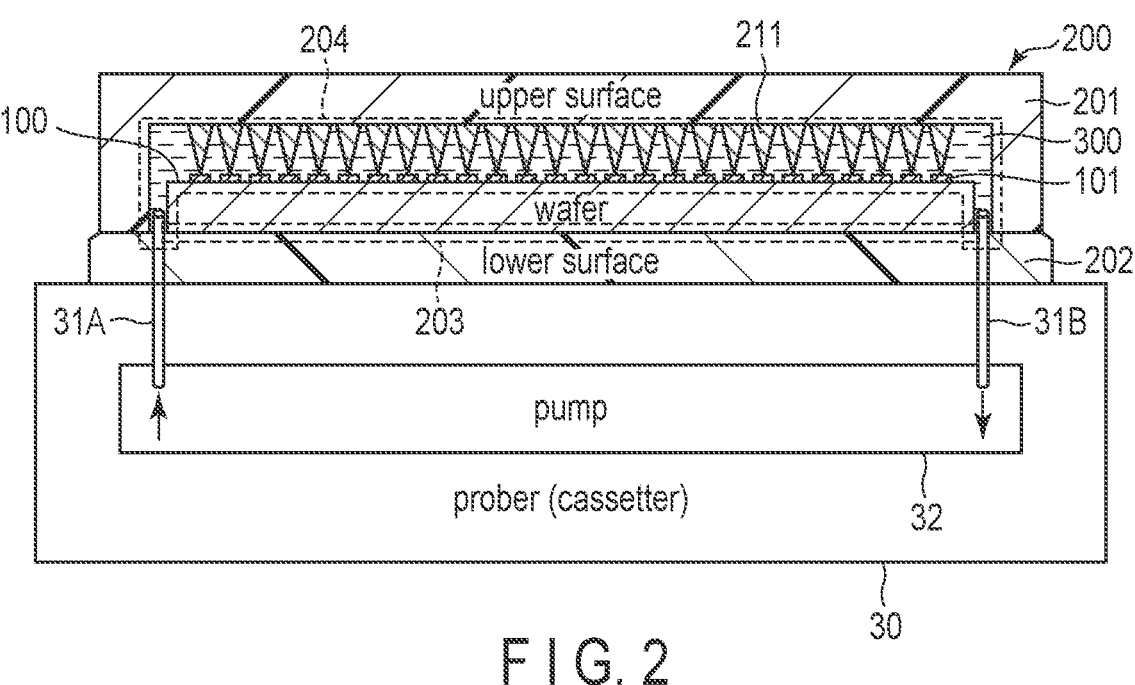
F I G. 2
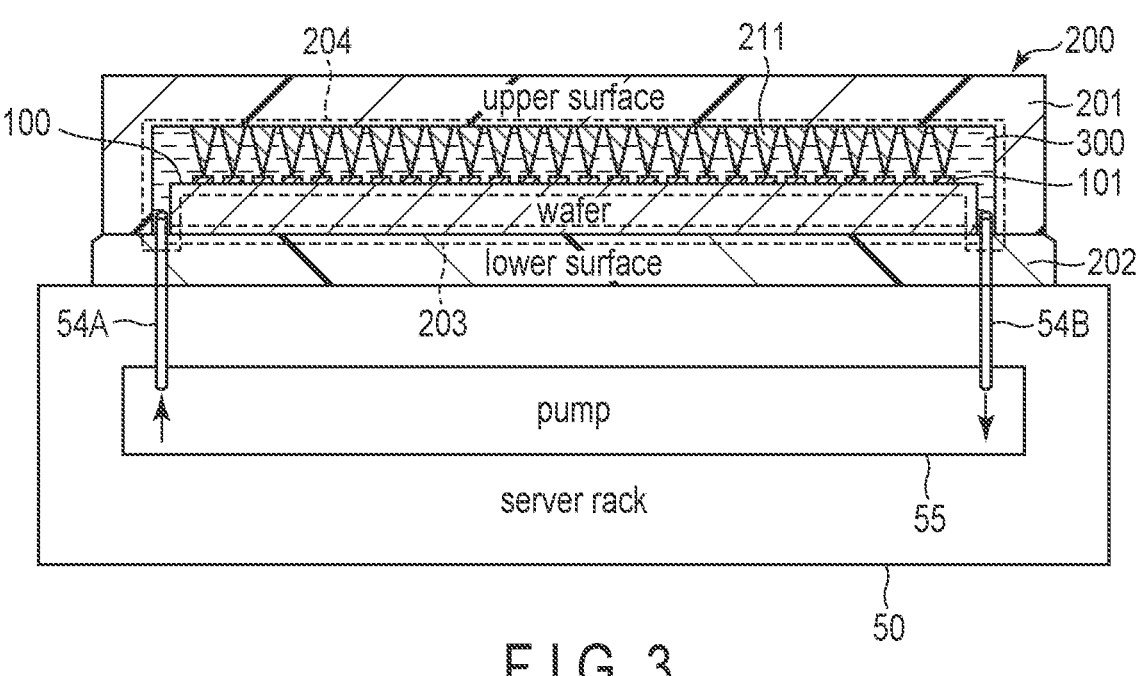
F I G. 3

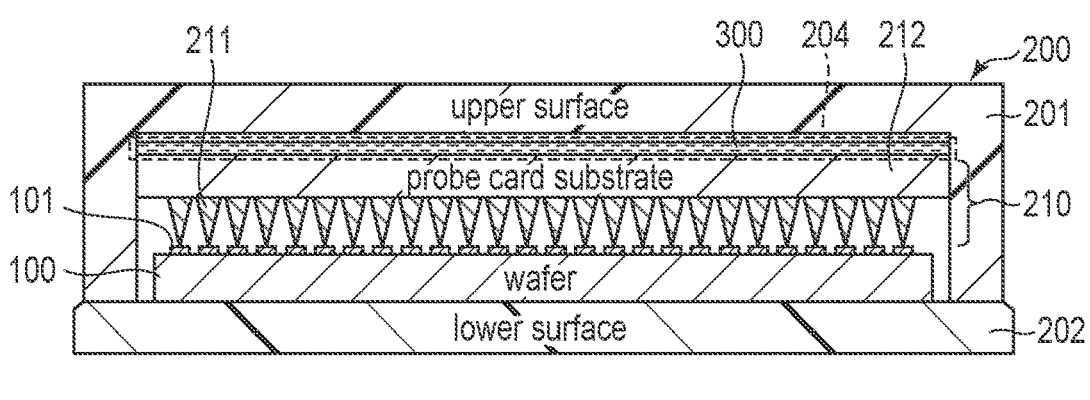
F I G. 4
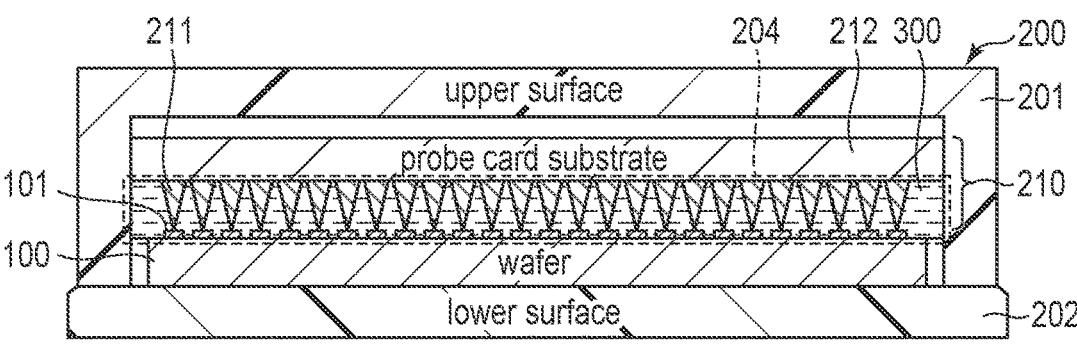
F I G. 5
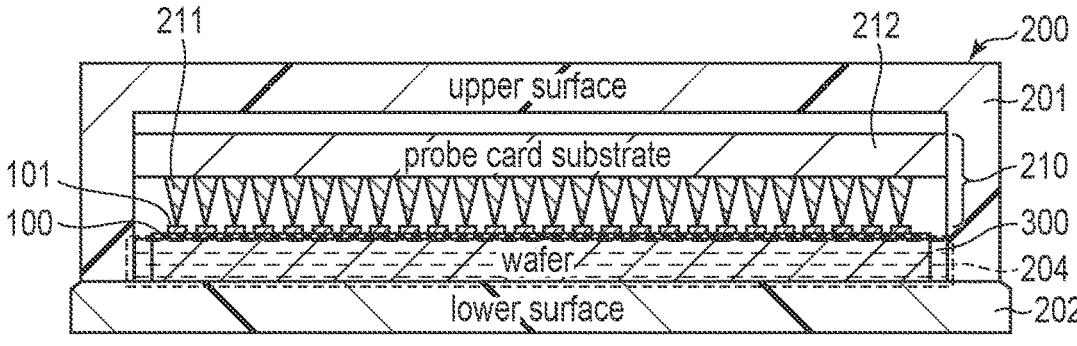
F I G. 6

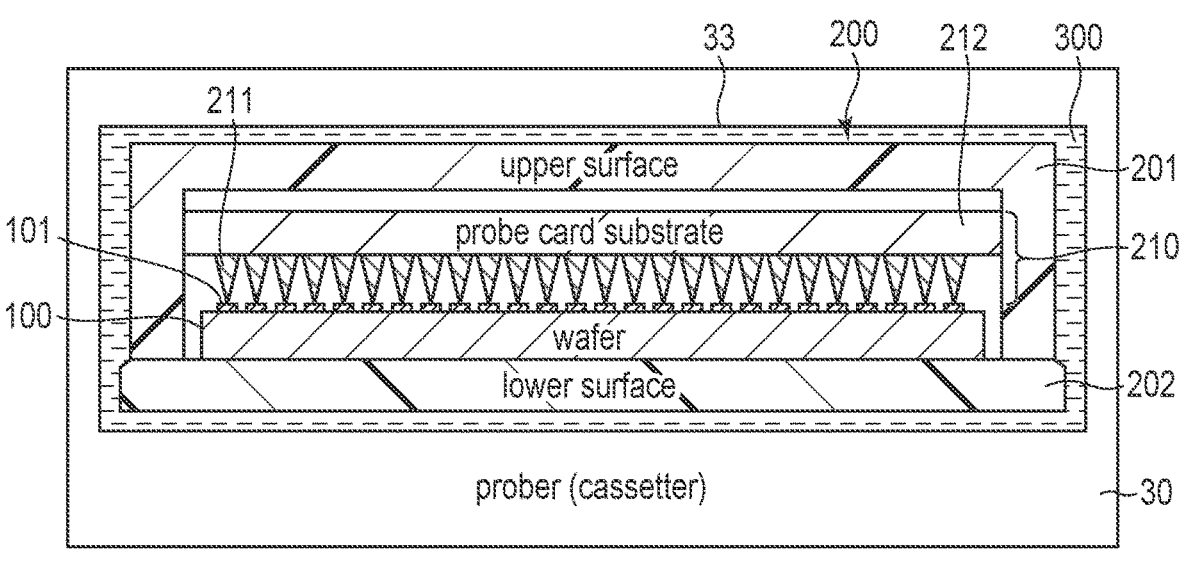
F I G. 7
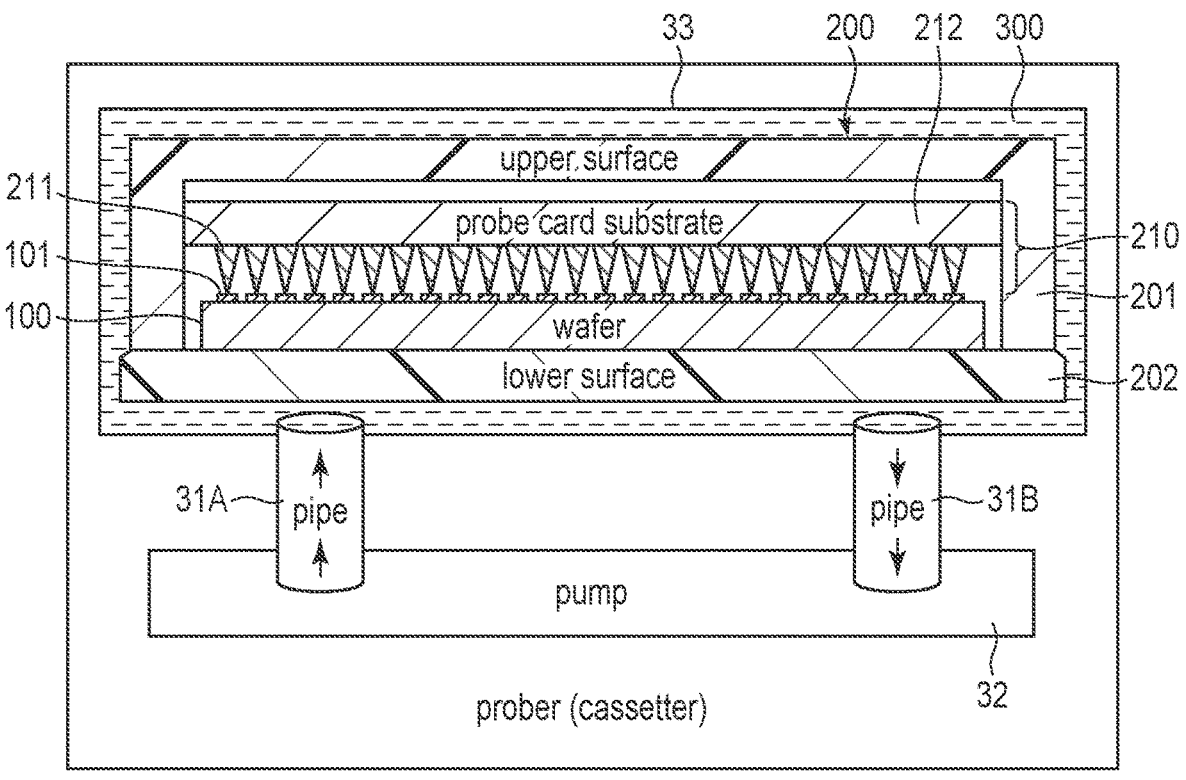
F I G. 8

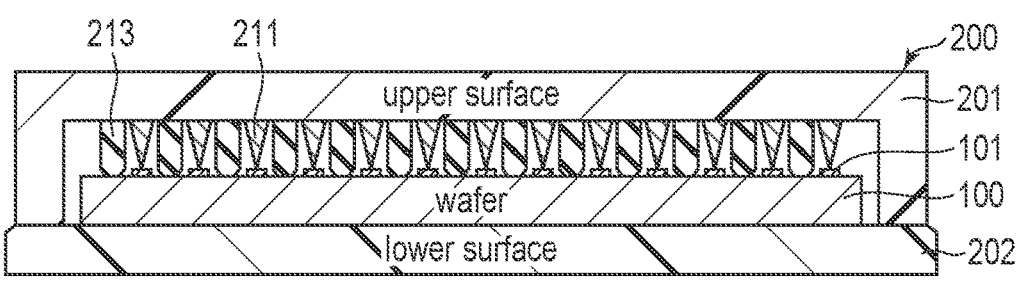
F I G. 9
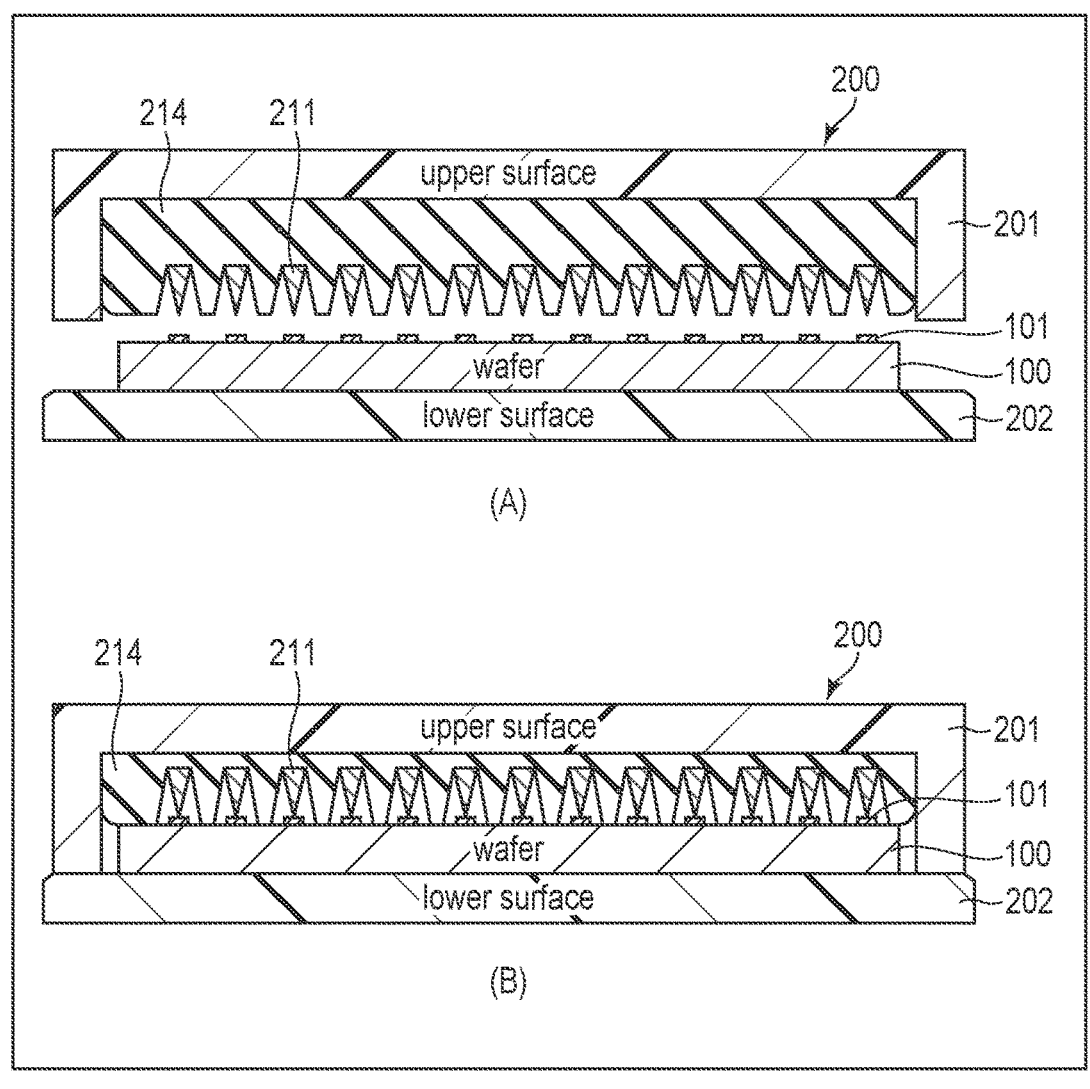
F I G. 10

CASSETTE HOUSING, PROBER, SERVER RACK, AND STORAGE SYSTEM

CROSS-REFERENCE TO RELATED APPLICATIONS

This application is a Continuation Application of PCT Application No. PCT/JP2021/011858, filed Mar. 23, 2021, the entire contents of which are incorporated herein by reference.

FIELD

Embodiments described herein relate generally to a cassette housing, a prober, a server rack, and a storage system.

BACKGROUND

Probe cards are used as inspection jigs to relay electrical signals between a semiconductor wafer on which semiconductor chips are formed and an inspection device that inspects the semiconductor chips. The semiconductor wafer further includes pad electrodes formed thereon. The probe cards each include a probe card substrate and a probe.

The probe card is electrically connected to a semiconductor wafer by a prober. More specifically, the prober brings the pad electrode of the semiconductor wafer into contact with the probe of the probe card. With this structure, the semiconductor chip of a semiconductor wafer is electrically connected to the probe card substrate of the probe card.

BRIEF DESCRIPTION OF THE DRAWINGS

FIG. 1 is a block diagram showing an example of a configuration of a storage system according to a first embodiment.

FIG. 2 is a diagram showing a temperature adjustment mechanism of a cassette housing and a prober of the storage system according to the first embodiment.

FIG. 3 is a diagram showing a temperature adjustment mechanism of a server rack of the storage system according to the first embodiment.

FIG. 4 is a diagram showing an example in which a probe card substrate is immersed in a cooling liquid in the cassette housing of the storage system according to the first embodiment.

FIG. 5 is a diagram showing an example in which a probe of a probe card and a pad electrode of a wafer are immersed in heat transfer fluid in the cassette housing of the storage system according to the first embodiment.

FIG. 6 is a diagram showing an example in which a wafer is immersed in heat transfer fluid in the cassette housing of the storage system according to the first embodiment.

FIG. 7 is a diagram showing an example in which a cassette housing storing a wafer is cooled or heated with heat-transfer fluid in a storage system according to a second embodiment.

FIG. 8 is a diagram showing a temperature adjustment mechanism of the storage system according to the second embodiment.

FIG. 9 is a diagram showing a temperature adjustment mechanism of a storage system according to a third embodiment.

FIG. 10 is a diagram showing a modified example of the temperature adjustment mechanism of the storage system according to the third embodiment.

DETAILED DESCRIPTION

In general, according to one embodiment, a cassette housing includes a storage unit, a probe card, and a container. The storage unit stores a semiconductor wafer including a plurality of nonvolatile memory chips. The probe card includes a probe. The probe is configured to be brought into contact with a pad electrode provided on the semiconductor wafer. The container contains heat transfer fluid for lowering or raising temperature of one or both of the probe card and the semiconductor wafer stored in the storage unit.

Embodiments will be described below with reference to the drawings.

(First Embodiment)

The first embodiment will now be described. The first embodiment is a high-capacity storage system that uses non-diced semiconductor wafers. Further, in the first embodiment, a plurality of semiconductor wafers are replaceable.

FIG. 1 is a block diagram showing an example of a configuration of a storage system 1 according to the first embodiment. The storage system 1 includes, as storage, a plurality of semiconductor wafers (or simply, wafers) 100. The storage system 1 selects a predetermined number of wafers 100 from the plurality of wafers 100. The storage system 1 uses the predetermined number of wafers 100 thus selected. The wafers 100 each include a plurality of NAND flash memory chips (NAND chips). Further, the storage system 1 includes a plurality of cassette housings 200. The cassette housings 200 each include a probe card 210. The cassette housings 200 each accommodate the wafer 100.

The storage system 1 further includes a wafer stocker 10, a cassette stocker 20, a prober (cassetter) a cassette transport device 40, and a server rack The wafer stocker 10 is a device for storing wafers 100. The wafer stocker 10 stores a plurality of wafers 100.

The cassette stocker 20 is a device for storing cassette housings 200. The cassette stocker 20 stores a plurality of cassette housings 200. The plurality of cassette housings 200 stored in the cassette stocker 20 may include both cassette housings 200 in which wafers 100 are stored and cassette housings 200 in which wafers 100 are not stored.

The prober 30 is a device which brings the pad electrodes 101 of the wafer 100 and the probes 211 of the probe card 210 into contact with each other, respectively.

The cassette transport device 40 is a device that transports the cassette housings 200. The cassette transport device 40 transports the cassette housings 200 from the cassette stocker 20 to the server rack 50. Further, the cassette transport device 40 transports the cassette housings 200 from the server rack 50 to the cassette stocker 20. Furthermore, the cassette transport device 40 transports the cassette housings 200 from the prober 30 to the server rack 50. The cassette transport device 40 transports the cassette housings 200 from the server rack 50 to the prober 30.

The server rack 50 is a device that stores a host computer 51. The number of host computers 51 stored in the server rack 50 may be one or more.

The host computer 51 is, for example, a file server. The host computer 51 includes a processor 52 and a storage unit 53.

The processor 52 is a device that executes programs. The processor 52 executes the process of writing data to or reading data from a wafer 100 in the cassette housing 200.

The storage unit 53 is a device for storing the cassette housings 200. The storage unit 53 stores the cassette housings 200 each storing the wafer 100. The number of cassette housings 200 stored in the storage unit 53 may be one or more.

Next, the internal configuration of the prober 30 will be described. The prober 30 includes an attachment/detachment device 31. The attachment/detachment device 31 is a device that integrates or separates the wafer 100 and the cassette housing 200 into or from each other. In the prober 30, when a wafer 100 is stored in a respective cassette housing 200 by the attachment/detachment device 31, the pad electrodes of the wafer 100 and the probes of the respective probe card 210 in the cassette housing 200 are brought into contact with each other. As a result, the NAND chip of the wafer 100 and the probe card substrate of the probe card 210 are electrically connected to each other.

Next, the replacement of wafers 100 in a cassette housing 200 stored in the server rack 50 with wafers 100 in a cassette housing 200 stored in the cassette stocker 20 or wafers 100 stored in the wafer stocker 10 will be explained.

When a wafer 100 on which the processor 52 of the host computer 51 is about to write or read data to or from is present in the server rack 50 while stored in the cassette housing 200, the storage system 1 does not need to replace the wafer 100.

When a wafer 100 on which the processor 52 is about to write or read data to or from is not present in the server rack 50, the storage system 1 carry out swapping of a wafer 100 in the cassette housing 200 stored in the server rack 50 with the wafer 100 in the cassette housing 20 stored in the cassette stocker, or the wafer 100 in the wafer stocker 10.

For example, when a wafer 100 on which the processor 52 is about to write data is present in the cassette stocker 20 while stored in the cassette housing 200, the storage system 1 swaps cassette housings 200 between the server rack 50 and the cassette stocker 20. The cassette housing 200 to be removed from the server rack 50 is, for example, the cassette housing 200 that stores the wafer 100 that has not been accessed by the processor 52 for the longest period of time in the server rack 50.

For example, when a wafer 100 on which the processor 52 is about to write data is present in the wafer stocker 10, the storage system 1 stores the wafer 100 which the processor 52 is about to write data to in the cassette housing 200 by the prober 30. Further, the storage system 1 removes from the server rack 50, a cassette housing 200 that stores the wafer 100 that has not been accessed by the processor 52 for the longest period of time in the server rack 50, for example. The storage system 1 moves the cassette housing 200 removed from the server rack 50 to the cassette stocker 20. Furthermore, the storage system 1 moves the cassette housing 200, which is made to store the wafer 100 by the prober 30, from the prober 30 to the server rack 50.

Next, a temperature adjustment mechanism will be described. The temperature adjustment mechanism is a mechanism that lowers or raises the temperature of the wafer 100. The temperature adjustment mechanism is provided in the cassette housing 200, the prober 30, and the server rack 50. FIG. 2 is a diagram showing the temperature adjustment mechanism of the cassette housing 200 and the prober 30.

First, the temperature adjustment mechanism of the cassette housing 200 will be explained. The cassette housing 200 includes an upper casing 201 and a lower casing 202. The upper casing 201 is a member that covers an upper surface side of the wafer 100. On the upper casing 201, the probe card 210 is placed. The lower casing 202 is a member that covers a lower surface side of the wafer 100. On an inner wall portion of the lower casing 202, a storage unit 203 is provided.

The upper casing 201 and the lower casing 202 are fit with each other to form a container 204. The container 204 accommodates heat transfer fluid 300 for lowering or raising temperature. The heat transfer fluid 300 is, for example, fluorocarbon-based hydrofluoroether. The heat transfer fluid 300 may as well be liquid nitrogen.

The container 204 includes an inlet port and an outlet port for the heat transfer fluid 300. While the cassette housing 200 is not stored in the prober 30 or the server rack 50, the inlet port and the outlet port of the heat transfer fluid 300 are closed. When the cassette housing 200 is stored in the prober 30 or the server rack 50, the inlet port and the outlet port of the heat transfer fluid 300 are open.

Next, the temperature control mechanism of the prober 30 will be described. The prober 30 includes a fluid supply pipe 31A, a fluid discharge pipe 31B and a pump (fluid device) 32. The fluid supply pipe 31A is a hollow cylindrical member, for example, used to transport the heat transfer fluid 300 from outside the cassette housing 200 to inside the cassette housing 200. The fluid discharge pipe 31B is a hollow cylindrical member, for example, used to transport the heat transfer fluid 300 from inside the cassette housing 200 to outside the cassette housing 200. The pump 32 is a device that transports the heat transfer fluid 300 from one end side of the fluid supply pipe 31A and the fluid discharge pipe 31B to the other end side.

When a wafer 100 is stored in the cassette housing 200 by the attachment/detachment device 31, the prober 30 injects the heat transfer fluid 300 from the fluid supply pipe 31A into the cassette housing 200 by the pump 32. When the wafer 100 is removed from the cassette housing 200 by the attachment/detachment device 31, the prober 30 discharges the heat transfer fluid 300 in the cassette housing 200 from the fluid discharge pipe 31B by the pump 32. The prober 30 circulates the heat transfer fluid 300 in the cassette housing 200.

Next, the temperature control mechanism of the server rack 50 will be described. FIG. 3 is a diagram showing the temperature adjustment mechanism of the server rack 50. FIG. 3 shows the temperature adjustment mechanism of the cassette housing 200 as well. The server rack 50 includes a fluid supply pipe 54A, a fluid discharge pipe 54B and a pump 55. The fluid supply pipe 54A is, for example, a hollow cylindrical member. The fluid supply pipe 54A is used to inject the heat transfer fluid 300 from outside the cassette housing 200 into the cassette housing 200. The fluid discharge pipe 54B is, for example, a hollow cylindrical member. The fluid discharge pipe 54B is used to discharge the heat transfer fluid 300 from inside the cassette housing 200 to outside the cassette housing 200. The pump 32 is a device that transports the heat transfer fluid 300 from one end side of the fluid supply pipe 54A and the fluid discharge pipe 54B to the other end side. The server rack 50 injects the heat transfer fluid 300 into the cassette housing 200. Further, the server rack 50 discharges the heat transfer fluid 300 from inside the cassette housing 200. Thus, the server rack 50 circulates the heat transfer fluid 300 in the cassette housing 200.

A cassette housing 200 that does not contain the heat transfer fluid 300 may be brought to the server rack 50 by the cassette transport device 40. In this case, after the cassette housing 200 stored in the cassette stocker 20 is brought to the server rack 50 by the cassette transport device 40, the cassette housing 200 is filled with the heat transfer fluid 300.

The server rack 50 may discharge all of the heat transfer fluid 300 in the cassette housing 200 when the cassette housing 200 is removed from the server rack 50. The cassette housing 200 storing the wafer 100 may be stored in the cassette stocker 20 while the heat transfer fluid 300 contained therein. Alternatively, the cassette housing 200 containing the wafer 100 may be stored in the cassette stocker 20 while the heat transfer fluid 300 not contained therein.

Subsequently, some examples of cooling in the cassette housing 200 by the heat transfer fluid 300 will be described below.

EXAMPLE 1

FIG. 4 shows a first example in which the probe card substrate of a probe card 210 is immersed in the heat transfer fluid 300 within the cassette housing 200. As explained above, the probe card 210 includes the probe card substrate 212 and the probe 211.

In this first example, the container 204 is formed so that the probe card substrate 212 is immersed in the heat transfer fluid 300. In the first example, the device on the probe card substrate 212 can be lowered or raised in temperature by the heat transfer fluid 300.

EXAMPLE 2

FIG. 5 shows a second example in which the probe 211 of the probe card 210 and the pad electrode 101 of the wafer 100 are immersed in the heat transfer fluid 300 in the cassette housing 200.

In the second example, the upper casing 201 and the lower casing 202 are fit with each other to form the container 204 so that the probe 211 and the pad electrode 101 are immersed in the heat transfer fluid 300. In the second example, the probe 211 of the probe card 210 and the pad electrode 101 of the wafer 100 can be lowered or raised in temperature by the heat transfer fluid 300.

Note that the temperature adjustment mechanism shown in FIG. 5 as the second example may be combined with the temperature adjustment mechanism shown in FIG. 4 as the first example.

EXAMPLE 3

FIG. 6 shows a third example in which the wafer 100 is immersed in the heat transfer fluid 300 in the cassette housing 200.

In the third example, the upper casing 201 and the lower casing 202 are fit with each other to form the container 204 for the heat transfer fluid 300 so that the wafer 100 is immersed in the heat transfer fluid 300. In the third example, the wafer 100 can be cooled by the heat transfer fluid 300. More specifically, the NAND chip formed on the wafer 100 can be lowered or raised in temperature by the heat transfer fluid 300.

Note that the temperature adjustment mechanism shown in FIG. 6 as the third example may be combined with one or both of the temperature adjustment mechanism shown in FIG. 4 as the first example and that shown in FIG. 5 as the second example.

As described above, the storage system 1 of the first embodiment includes its independent temperature adjustment mechanism for circulating the heat transfer fluid in the cassette housing 200. With this structure, the storage system

1 of the first embodiment can carry out the temperature adjustment with respect to the wafer 100 containing a plurality of NAND chips.

(Second Embodiment)

Next, a second embodiment will be described.

The second embodiment, as in the case of the first embodiment, is a high-capacity storage system that uses non-diced semiconductor wafers. The same structural elements as those of the first embodiment are designated by the same reference symbols. Further, explanations regarding the same structural elements as those of the first embodiment will be omitted.

FIG. 7 is a diagram showing an example in which a cassette housing 200 storing a wafer 100 is lowered or raised in temperature with the heat transfer fluid 300 in a storage system 1 of the second embodiment. FIG. 7 shows a state in which the cassette housing 200 storing the wafer 100 is stored in the prober 30.

The storage system 1 of the first embodiment circulates the heat transfer fluid 300 in the cassette housing 200. On the other hand, in the storage system 1 of the second embodiment, the cassette housing 200 itself is immersed in the heat transfer fluid 300 in the prober 30 and the server rack 50. Thus, in the storage system 1 of the second embodiment, the entire cassette housing 200 is lowered or raised in temperature. For this purpose, the prober 30 includes a container 33. The container 33 is a device that contains the heat transfer fluid 300. The container 33 is provided to seal the cassette housing 200. The server rack 50 includes a container 56. The container 56 is a device that contains the heat transfer fluid 300. The container 56 is provided to seal the cassette housing 200.

FIG. 8 is a diagram showing the temperature adjustment mechanism of the storage system 1 of the second embodiment. In FIG. 8, the cassette housing 200 is accommodated in the prober 30.

In the first embodiment, the prober 30 injects the heat transfer fluid 300 into the cassette housing 200 by use of the fluid supply pipe 31A, the fluid discharge pipe 31B, and the pump 32. Further, the prober 30 discharges the heat transfer fluid 300 from inside the cassette housing 200. Thus, the prober circulates the heat transfer fluid 300 in the cassette housing 200. On the other hand, in the second embodiment, the prober 30 injects the heat transfer fluid 300 into the container 33 by use of the fluid supply pipe 31A, the fluid discharge pipe 31B, and the pump 32. Further, the prober 30 discharges the heat transfer fluid 300 from inside the container 33. Thus, the prober 30 circulates the heat transfer fluid 300 in the prober 30. More specifically, the prober 30 circulates the heat transfer fluid 300 around the cassette housing 200. The server rack 50 injects the heat transfer fluid 300 to the container 56. Further, the server rack 50 discharges the heat transfer fluid 300 from the container 56. Thus, the server rack 50 circulates the heat transfer fluid 300 in the server rack 50. More specifically, the server rack 50 circulates the heat transfer fluid 300 around the cassette housing 200.

An example of cooling the cassette housing 200 with the prober 30 is, for example, the case where a cassette housing 200 that has been removed from the server rack 50 and transported thereto is cooled. The wafer 100 in the cassette housing 200, which has been removed from the server rack 50, is stored in the cassette stocker 20 while being contained in the cassette housing 200. Or, the wafer 100 in the cassette housing 200, which has been removed from the server rack 50, is stored in the wafer stocker 10 in a state which has been removed from the cassette housing 200. Note here that when the cassette housing 200 is brought from the server rack 50 to the prober 30, the temperature of the wafer 100 in the cassette housing 200 may have been raised in the server rack 50. The prober 30 cools the wafer 100 whose temperature has been raised in the server rack 50, before moving it to the wafer stocker 10, for example, by cooling the entire cassette housing 200 so as not to affect other wafers 100 that are stored at a lower temperature.

Cooling of the cassette housing 200 in the server rack 50 is carried out to suppress the temperature rise of the wafer 100 due to heat generated by devices on the probe card substrate 212, for example.

As described above, the storage system 1 of the second embodiment has a unique temperature control mechanism that circulates heat transfer fluid around the cassette housing 200. As a result, the storage system 1 of the second embodiment can carry out temperature adjustment with respect to the wafer 100 containing multiple NAND chips.

(Third Embodiment)

Next, a third embodiment will be described.

The third embodiment, as in the cases of the first embodiment and the second embodiment, is also a high-capacity storage system that uses non-diced semiconductor wafers. As to the structural elements identical to those of the first embodiment and the second embodiment, the same reference symbols as those are used here. Further, explanations regarding the identical structural elements to those of the first and second embodiments will be omitted.

FIG. 9 is a diagram showing the temperature adjustment mechanism of a storage system 1 according to the third embodiment.

In the storage systems 1 of the first embodiment and the second embodiment, lowering or raising temperature is carried out by heat transfer fluid. By contrast, the storage system 1 of the third embodiment brings insulating members 213 into contact with the wafer 100. In this manner, the storage system 1 of the third embodiment carries out lowering or raising in temperature by thermal conduction. The insulating members 213 are provided on a surface where the probes 211 of the probe card 210 are placed in the cassette housing 200, which opposes the wafer 100 stored in the cassette housing 200. The surface on which the probes 211 of the probe card 210 are provided is exposed from an inner wall portion of the upper casing 201.

When the prober 30 stores a wafer 100 in the cassette housing 200, the insulating members 212 are physically brought into contact with the wafer 100 when the upper casing 201 and the lower casing 202 are fit with each other. However, the insulating members 213 are not electrically connected to the wafer 100. The insulating members 213 each have, for example, a shape of a pin, a projection, or a plane.

By use of heat conduction mediated by the insulating members 212, which are not electrically connected to the wafer 100, the storage system 1 of the third embodiment can carry out the temperature adjustment with respect to the wafer 100, which includes multiple NAND chips.

FIG. 10 is a diagram showing a modified example of the temperature adjustment mechanism in the third embodiment.

FIG. 10 shows an example in which the insulating members 213 of FIG. 9 are provided as cushions 214 that reduces the propagation to the wafer 100 of shocks given to the cassette housing 200 during transportation thereof, for example. Further, the cushions 214 secures the wafer 100 within the cassette housing 200. FIG. 10, part (A), shows the state of the cushions 214 before the upper casing 201 and the lower casing 202 are fit with each other. FIG. 10, part (B) shows the state of the cushions 214 after the upper casing 201 and the lower casing 202 are fit with each other.

When the prober 30 stores the wafer 100 in the cassette housing 200, the cushions 214, which are insulator, are physically brought into contact with the wafer 100 when the upper casing 201 and the lower casing 202 are fit with each other as shown in FIG. 10, part (B). However, the cushions 214 are not electrically connected to the wafer 100. In this modified example, the temperature adjustment with respect to the wafer 100 including a plurality of NAND chips can be carried out by heat conduction mediated by the cushions 214, which are not electrically connected to the wafer 100.

As described above, in the storage system 1 of the third embodiment, the insulators 213 are brought into contact with the wafer 100 in the cassette housing 200. That is, the storage system 1 of the third embodiment includes a unique temperature adjustment mechanism that carries out lowering or raising in temperature by thermal conduction. In this manner, the storage system 1 of the third embodiment can carry out the temperature adjustment with respect to the wafer 100 containing multiple NAND chips.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A cassette housing comprising:
a storage unit configured to store a semiconductor wafer that includes a plurality of nonvolatile memory chips;
a probe card that includes a probe configured to be brought into contact with a pad electrode provided on the semiconductor wafer; and
a container configured to contain heat transfer fluid for lowering or raising temperature of one or both of the probe card and the semiconductor wafer stored in the storage unit, wherein
in a state in which (A) the storage unit stores the semiconductor wafer and (B) the probe of the probe card is brought into contact with the pad electrode provided on the semiconductor wafer, the cassette housing is movable to a stocker.

2. The cassette housing of claim 1, wherein
the probe card has a first surface and a second surface, the first surface facing the semiconductor wafer stored in the storage unit, the second surface being opposite to the first surface, and
the container is configured such that a printed circuit board provided on the second surface of the probe card is immersed in the heat transfer fluid.

3. The cassette housing of claim 1, wherein
the probe card has a first surface facing the semiconductor wafer stored in the storage unit, the probe being provided on the first surface,
the semiconductor wafer has a second surface, the second surface facing the first surface of the probe card when stored in the storage unit, the pad electrode being provided on the second surface, and
the housing is configured such that the probe provided on the first surface of the probe card, and the pad electrode provided on the second surface of the semiconductor wafer, are immersed in the heat transfer fluid liquid.

4. The cassette housing of claim 1, wherein
the container is configured such that the semiconductor wafer stored in the storage unit is immersed in the heat transfer fluid.

5. The cassette housing of claim 1, wherein
the heat transfer fluid includes fluorocarbon.

6. The cassette housing of claim 1, wherein
the probe card includes an insulating member provided on a surface facing the semiconductor wafer stored in the storage unit, the insulating member being configured to be in physical contact with the semiconductor wafer and not electrically connected to the semiconductor wafer.

7. The cassette housing of claim 6, wherein
the insulating member has a shape of a pin, a projection, or a plane.

8. The cassette housing of claim 6, wherein
the insulating member is provided as a cushion that reduces propagation to the semiconductor wafer by impact given to the cassette housing and is configured to secure the semiconductor wafer within the cassette housing.

9. A storage system comprising:
a prober; and
a server rack,
wherein
the server rack includes:
  a processor;
  a first storage unit configured to store a cased memory device, the cased memory device including a first container, a memory device, and a housing in which the memory device is mounted, the first container being configured to contain heat transfer fluid for lowering or raising temperature of the memory device, the memory device being a semiconductor wafer and including a plurality of nonvolatile memory chips to or from which writing or reading of data is to be required from the processor, the housing being a cassette housing in which a probe card is disposed, the probe card including a probe configured to be brought into contact with a pad electrode provided on the semiconductor wafer;

a first fluid device configured to inject or discharge the heat transfer fluid to or from the first container when the cased memory device is stored in the first storage unit, for lowering or raising temperature of one or both of the semiconductor wafer and the probe card; and
  a second container configured to contain the heat transfer fluid, wherein
the prober includes:
  an attachment/detachment device configured to integrate or separate the semiconductor wafer and the cassette housing with or from each other; and
  a third container configured to contain the heat transfer fluid.

10. A storage system comprising:
a prober; and
a server rack,
wherein
the server rack includes:
  a processor;
  a first storage unit configured to store a cased memory device, the cased memory device including a first container, a memory device, and a housing in which the memory device is mounted, the first container being configured to contain heat transfer fluid for lowering or raising temperature of the memory device, the memory device including a plurality of nonvolatile memory chips to or from which writing or reading of data is to be required from the processor;
  a first fluid device configured to inject or discharge the heat transfer fluid to or from the first container when the cased memory device is stored in the first storage unit; and
  a second container configured to contain the heat transfer fluid, wherein
the prober includes:
  an attachment/detachment device configured to integrate or separate the memory device and the housing with or from each other; and
  a third container configured to contain the heat transfer fluid.

* * * * *